US010512152B2

(12) United States Patent
Smith et al.

(10) Patent No.: US 10,512,152 B2
(45) Date of Patent: Dec. 17, 2019

(54) DEVICE ARRAY BACKFRAME WITH INTEGRAL MANIFOLDING FOR HIGH PERFORMANCE FLUID COOLING

(71) Applicant: Massachusetts Institute Of Technology, Cambridge, MA (US)

(72) Inventors: James Paul Smith, Chelmsford, MA (US); Bernard A. Malouin, Jr., Westford, MA (US); Eric A. Browne, Westford, MA (US); Kenneth L. Smith, Littleton, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 0 days.

(21) Appl. No.: 16/037,082

(22) Filed: Jul. 17, 2018

(65) Prior Publication Data

US 2019/0029105 A1    Jan. 24, 2019

Related U.S. Application Data

(60) Provisional application No. 62/535,326, filed on Jul. 21, 2017.

(51) Int. Cl.
*H05K 1/02* (2006.01)
*H05K 7/20* (2006.01)
*H01L 23/473* (2006.01)

(52) U.S. Cl.
CPC ......... *H05K 1/0207* (2013.01); *H01L 23/473* (2013.01); *H05K 1/0272* (2013.01); *H05K 7/205* (2013.01); *H05K 7/20263* (2013.01); *H05K 7/20281* (2013.01)

(58) Field of Classification Search
CPC . F24H 9/2035; F24H 1/52; F24H 1/08; F24H 9/144; F24D 19/1066; F24D 2220/0235; F24D 2220/0271
See application file for complete search history.

(56) References Cited

U.S. PATENT DOCUMENTS

| 9,042,100 B2 * | 5/2015 | Kang | G06F 1/20 361/703 |
|---|---|---|---|
| 2006/0162899 A1 * | 7/2006 | Huang | H01L 23/467 165/80.4 |
| 2010/0032147 A1 * | 2/2010 | Valenzuela | F28F 3/12 165/163 |
| 2010/0195282 A1 * | 8/2010 | Lu | H05K 5/06 361/693 |
| 2013/0056176 A1 * | 3/2013 | Valenzuela | F28F 21/00 165/81 |

(Continued)

*Primary Examiner* — Rockshana D Chowdhury
(74) *Attorney, Agent, or Firm* — Nields, Lemack & Frame, LLC

(57) ABSTRACT

The present invention generally relates to an array backframe with integral manifolding for high performance fluid cooling of devices. The integral manifolding of the array backframe is designed to perform three functions. First, the array backframe parallelizes the fluid paths to provide uniform, cool supply fluid to every device in the array. Second, the array backframe minimizes the parasitic heat losses between supply and exhaust by use of an isolation cavity. Third, the array backframe collapses hundreds of fluid lines into a single internal manifold to enhance modularity while also serving as a structural support member.

16 Claims, 5 Drawing Sheets

(56) References Cited

U.S. PATENT DOCUMENTS

2014/0160677 A1\* 6/2014 de Bock ............. H01L 23/4735
　　　　　　　　　　　　　　　　　　　　　　361/689
2015/0016053 A1\* 1/2015 Donner ................... F25D 21/14
　　　　　　　　　　　　　　　　　　　　　　361/679.46

\* cited by examiner

DEVICE ARRAY BACKFRAME WITH INTEGRAL MANIFOLDING FOR HIGH PERFORMANCE FLUID COOLING

This application claims priority to U.S. Provisional Patent Application Ser. No. 62/535,326 filed Jul. 21, 2017, the disclosure of which is incorporated herein by reference in its entirety.

This invention was made with Government support under Contract No. FA8721-05-C-0002 awarded by the United States Air Force. The Government has certain rights in the invention.

BACKGROUND OF THE INVENTION

Many electronic components, such as processing units, and radio frequency (RF) devices, are commonly used in many of today's circuits and generate significant amounts of heat. For example, RF devices, such as high electron mobility transistors (HEMTs), are commonly used in radar (aircraft surveillance, weather surveillance, tactical); electronic warfare (EW), including jamming; RF communication systems; and other applications. Processing units, such as CPUs, are commonly used in computers, laptops, mobile electronics, and other applications.

A limiting factor in many of these applications is the maximum component temperature of the heat generating device. Component lifetime is a function of maximum temperature, and as such, a trade-off is often made between lifetime, maximum power output, and/or duty cycle.

The maximum component temperature in these heat generating devices is governed by heat transfer at several layers.

First, the conductive thermal resistance through the heat generating component itself is a factor in determining the maximum component temperature. The electrically active region of a heat generating device is typically located on one side of a semiconductor substrate, which may be, for example, silicon, gallium nitride, or gallium arsenide. This is the region where waste heat is generated. This heat must be conducted through the substrate before being dissipated through the thermal management system.

Second, the heat transfer from the surface of the semiconductor substrate to the thermal management system is a factor in determining the maximum component temperature. Thermal management systems usually conduct heat from the heat generating device into a spreader or heat sink. These systems then dissipate the heat to the ambient environment, such as via free convection, conduction, or radiation, or to a coolant, using forced convection.

For many of these thermal management systems, including forced convection cooling, the size, weight, and power (SWaP) of existing thermal management solutions often drives the design, ultimately limiting their performance. In some embodiments, this challenge is exacerbated by the need to cool an array of heat generating components. For example, a printed circuit board may contain a plurality of heat generating components that are arranged as a matrix on the board. This configuration presents a number of challenges.

First, many existing implementations of fluid cooling at the device level have a defined fluid inlet (cool supply) and fluid outlet (warm exhaust). To provide the greatest cooling to all devices in an array, the inlet for each device must be kept at the lowest possible temperature. When devices are arranged in an array, the inlet fluid from device to device can vary. For example, if device fluid paths are daisy-chained to minimize the number of fluid lines, then the warm exhaust of one device becomes the cool supply for the next. This degrades the thermal performance as more devices are added to the array, and leads to poor temperature uniformity across the array.

Second, the parasitic losses between the cool supply fluid and warm exhaust fluid degrade performance for all devices in an array. Even with single devices, the mere proximity of cool supply fluid and warm exhaust fluid produces parasitic losses whereby the warm exhaust fluid will warm the cool supply fluid. This is particularly exacerbated in arrays where many fluid channels are likely to be in close proximity. These parasitic losses inhibit an arrayed system from reaching maximum performance.

Third, arrays of individually fluid-cooled devices impede panel modularity. Arrays of devices, each with their own cooling, can become inordinately complex for system integration. For example, an 8×8 array would have over 100 fluid lines if they are all plumbed individually.

Therefore, it would be beneficial if there were a thermal management system that addressed these challenges by providing an array backframe with integral manifolding for high performance fluid cooling of devices.

SUMMARY OF THE INVENTION

The present invention generally relates to an array backframe with integral manifolding for high performance fluid cooling of devices. The integral manifolding of the array backframe is designed to perform three functions. First, the array backframe parallelizes the fluid paths to provide uniform, cool supply fluid to every device in the array. Second, the array backframe minimizes the parasitic heat losses between supply and exhaust by use of an isolation cavity. Third, the array backframe collapses hundreds of fluid lines into a single internal manifold to enhance modularity while also serving as a structural support member.

According to one embodiment, an array backframe is disclosed. The array backframe comprises a supply manifold comprising a fluid inlet and a supply cavity in communication with the fluid inlet; an exhaust manifold comprising an exhaust cavity and a plurality of openings and drainage openings on a top surface, wherein the plurality of openings are in communication with the supply cavity and the drainage openings are in communication with the exhaust cavity; and a low conductivity layer, disposed between the supply manifold and the exhaust manifold to thermally isolate the supply cavity and the exhaust cavity. In certain embodiments, the exhaust manifold comprises a plurality of hollow projections extending downward from the top surface, wherein the hollow projections pass through conduits in the low conductivity layer and terminate in the supply cavity. In certain embodiments, the low conductivity layer comprises a top surface proximate the exhaust manifold and a bottom surface proximate the supply manifold, and an isolation cavity is disposed between the top surface and the bottom surface. In some embodiments, the isolation cavity is maintained in a partial vacuum condition. In some embodiments, the isolation cavity is filled with openings heat generating devices air or foam. In certain embodiments, the low conductivity layer comprises two or more sheets, which, when joined, create the isolation cavity. In certain embodiments, the openings comprise microjets. In some embodiments, the exhaust cavity is in communication with a fluid outlet, and the fluid outlet is disposed in the supply manifold. In other embodiments, the fluid output is disposed in the exhaust manifold.

According to another embodiment, an assembly is disclosed. The assembly comprises a printed circuit board having a plurality of heat generating devices mounted thereon, affixed to the array backframe. In certain embodiments, the each of the openings is aligned with a respective one of the heat generating devices. In certain embodiments, the low conductivity layer comprises a top surface proximate the exhaust manifold and a bottom surface proximate the supply manifold, and an isolation cavity is disposed between the top surface and the bottom surface.

According to another embodiment, an assembly is disclosed. The assembly comprises an array backframe, comprising: a supply manifold comprising a fluid inlet and a supply cavity in communication with the fluid inlet; an exhaust manifold comprising an exhaust cavity and a plurality of openings and drainage openings on a top surface, wherein the openings are in communication with the supply cavity and the drainage openings are in communication with the exhaust cavity; and a low conductivity layer, disposed between the supply manifold and the exhaust manifold to thermally isolate the supply cavity and the exhaust cavity; a printed circuit board having a plurality of heat generating devices mounted thereon, affixed to the top surface of the array backframe; and a fluid, wherein the fluid enters the supply cavity via the fluid inlet, passes through hollow projections connecting the supply cavity and the openings and impacts the heat generating devices on the printed circuit board. In certain embodiments, the hollow projections are in communication with the openings and extend downward from the top surface, wherein the hollow projections pass through conduits in the low conductivity layer and terminate in the supply cavity. In certain embodiments, the fluid enters the drainage openings after impacting the heat generating devices and passes into the exhaust cavity. In some embodiments, the fluid in the supply cavity is at a lower temperature than the fluid in the exhaust cavity, and a temperature difference is maintained due to the low conductivity layer. In some embodiments, the fluid exits the exhaust cavity through an outlet in the supply manifold. In other embodiments, the fluid exits the exhaust cavity through an outlet in the exhaust manifold.

BRIEF DESCRIPTION OF THE DRAWINGS

For a better understanding of the present disclosure, reference is made to the accompanying drawings, in which like elements are referenced with like numerals, and in which.

DETAILED DESCRIPTION

As described above, in certain embodiments, a printed circuit board may include a plurality of heat generating devices. The need to cool all of these heat generating devices is paramount, but very difficult.

Figure 1B:
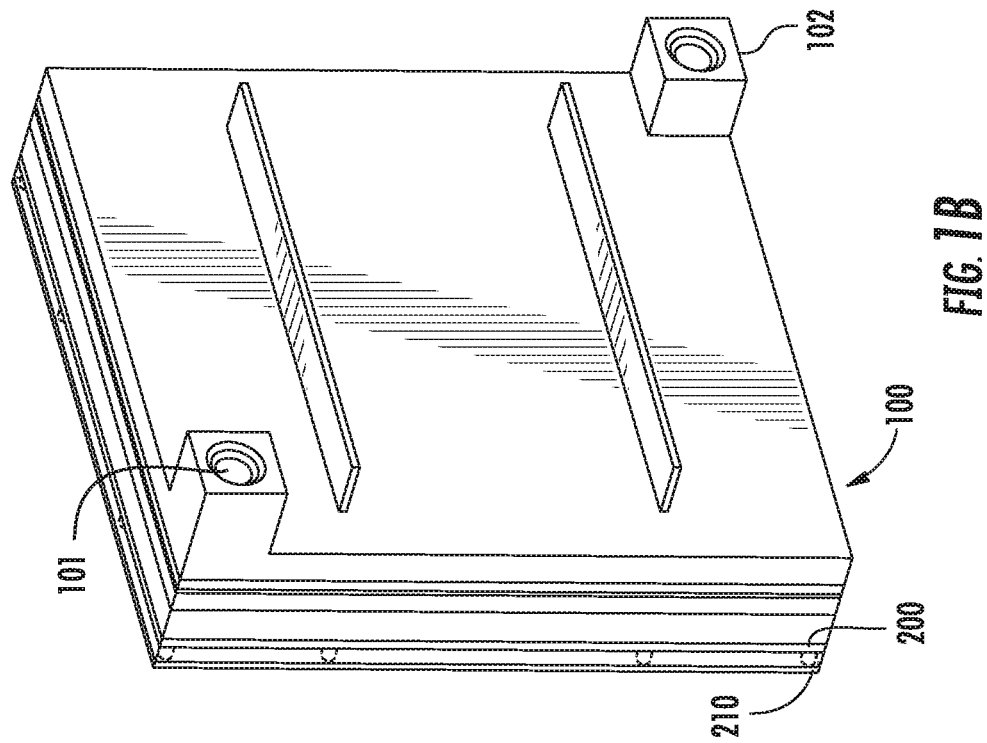
FIGS. 1A-1B are illustrations of the top view and bottom view, respectively, of an assembly, in which the array backframe is attached to a printed circuit board, according to one embodiment.
Figure 1A:
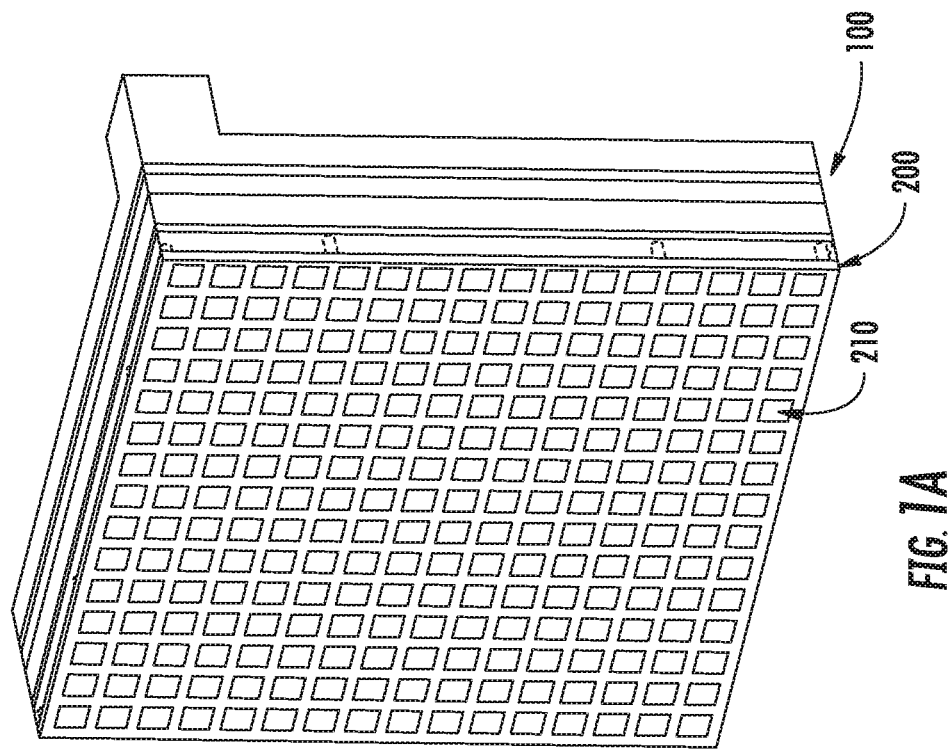

FIG. 1A shows a top view of an assembly, comprising a printed circuit board (PCB) 200 mounted to an array backframe 100. The array backframe 100 has integrated manifolds for high performance fluid cooling. FIG. 1B is a bottom view of the assembly. In FIGS. 1A-1B, the printed circuit board 200 may include a patch antenna array 210. In other embodiments, the printed circuit board 200 may include other devices. In FIGS. 1A-1B, a patch antenna array 210 of RF components is mounted to the PCB 200. The heat dissipating components are mounted to the backside of the PCB 200. This PCB 200 is then mounted onto the array backframe 100 with integral fluid cooling manifolds. The array backframe 100 reduces the number of plumbing connections from over one hundred to just two. As seen in FIG. 1B, the array backframe 100 has a fluid inlet 101 and a fluid outlet 102. The array backframe 100 with integral fluid cooling manifolds also performs other roles in the assembly. The array backframe 100 serves as the primary mounting interface for the PCB 200, the structural member of the assembly, and the line-replaceable unit. This serves to reduce system size, weight, and assembly complexity.

Figure 2:
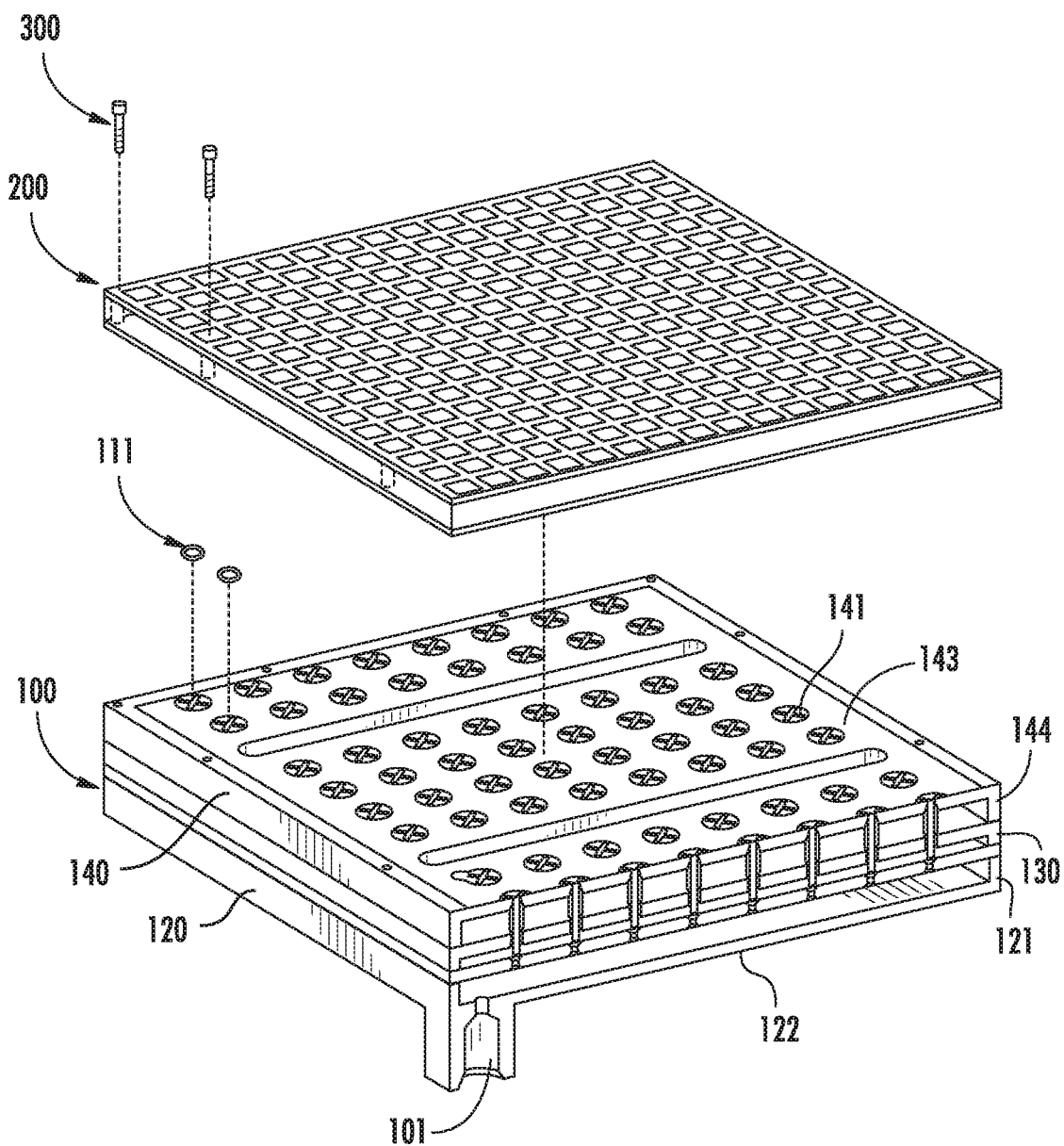
FIG. 2 is a view of the assembly of FIG. 1A, showing the connection between the array backframe and the printed circuit board.

FIG. 2 shows a view of the assembly of FIG. 1A, showing the connection between the array backframe 100 and the PCB 200. In this view, the internal manifolds are visible, providing fluid cooling to each of the heat generating devices on the PCB 200. Additionally, the layers that make up the array backframe 100 are visible, and will described in more detail below.

On the top surface of the array backframe 100, which is the surface that is proximate to the PCB 200, there are a plurality of openings 141. Each of these openings 141 may be a fluid passageway, allowing supply fluid which enters through the fluid inlet 101 to be directed at one of the heat generating devices 201 (see FIG. 4) on the PCB 200. Each opening 141 may be surrounded by a seal 111, such as an O-ring. The seal 111 may maintain a physical connection between the top surface of the array backframe 100 and the PCB 200 or between top surface of the array backframe 100 and the heat generating devices 201 on the PCB 200. The PCB 200 may be affixed to the array backframe 100 using fasteners 300.

In certain embodiments, the openings 141 may comprise microjets. Microjet impingement is a heat transfer technique by which a fluid jet or an array of fluid jets impinge onto a surface for the purpose of transferring heat between the surface and the fluid of the jet. Jets can be formed by the use of nozzles, tubes or an orifice plate and are characterized by having a substantially higher momentum in one direction than the surrounding fluid. Typically, a turbulent jet exit velocity profile is flat across the radius, reducing to zero at the edge due to the presence of the nozzle. This high velocity jet suppresses the thermal boundary layer at the heat transfer surface resulting in high heat transfer coefficients.

Of course, other embodiments are possible where the openings 141 may feed devices cooled by microchannels, spray cooling, or cryogenic fingers. The openings 141 may simply be used to introduce cool supply fluid to the heat generating device 201.

Figure 3:
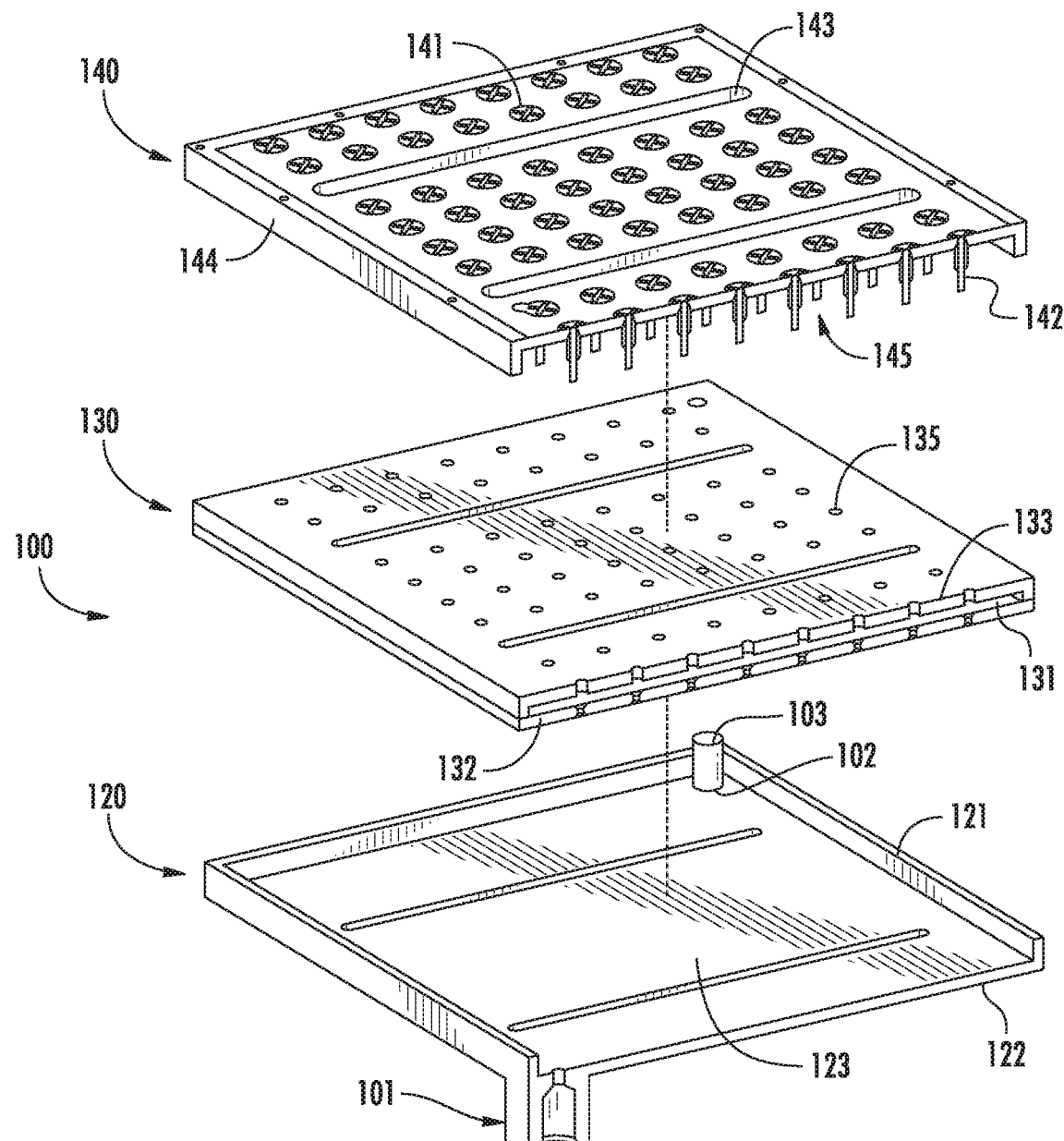
FIG. 3 is an exploded view of the array backframe, showing the internal layers.

FIG. 3 is an exploded view of the array backframe 100, showing the internal layers. The outermost layer, known as the supply manifold 120, includes the fluid inlet 101 and serves as the cold supply plenum. The fluid outlet 102 is also provided on the supply manifold 120, however, the fluid outlet 102 is thermally isolated from the rest of the supply manifold 120. The supply manifold 120 may be constructed of any suitable material, such as a metal or a plastic material. The supply manifold 120 may have raised sidewalls 121 and a base 122, so as to form a supply cavity 123, which may become filled with the supply fluid as it enters the supply manifold 120 through the fluid inlet 101.

The low conductivity layer 130 rests on top of the sidewalls 121 of the supply manifold 120. The low conductivity layer 130 may be a single layer, or may comprise a plurality of layers. In certain embodiments, the low conductivity layer 130 is fabricated using 3D printing. The use of 3D printing allows the low conductivity layer 130 to be formed with an isolation cavity 131 disposed therein. In one embodiment, the low conductivity layer 130 is fabricated as a single component, where the isolation cavity 131 is disposed therein. In another embodiment, the low conductivity layer 130 is formed as two separate sheets, which, when joined together, create an isolation cavity 131 therebetween. The low conductivity layer 130 may be manufactured from any suitable material, including metal or plastic. For example, FIG. 3 shows the low conductivity layer 130 formed as two sheets. As noted above, the low conductivity layer 130 includes an isolation cavity 131 disposed within it. This isolation cavity provides much of the thermal isolation benefit of the array backframe. In one embodiment, this isolation cavity 131 may be under partial vacuum conditions. In another embodiment, the isolation cavity 131 may be filled with a low conductivity foam material. In both embodiments, the isolation cavity 131 serves to increase the thermal isolation between the supply manifold 120 and the exhaust manifold 140. Thus, in these embodiments, the low conductivity layer 130 comprises a supply interface layer 132, which abuts the supply cavity 123, an exhaust interface layer 133, which abuts the exhaust cavity 145, and an isolation cavity 131 disposed between these two layers.

Thus, throughout this disclosure, the phrase "low conductivity layer" is used to denote the component or components that are disposed between the supply cavity 123 and the exhaust cavity 145. In certain embodiments, the low conductivity layer 130 is a single unitary component. In other embodiments, the low conductivity layer 130 comprises two or more sheets that are joined to create the low conductivity layer 130 with the isolation cavity 131.

The low conductivity layer 130 includes a plurality of conduits 135, which provide the pathways to transport supply fluid from the supply cavity 123 in the supply manifold 120 to the openings 141 on the top of the exhaust manifold 140. These conduits 135 pass through the supply interface layer 132, the isolation cavity 131 and the exhaust interface layer 133, before passing to the exhaust manifold 140.

Although not shown, the low conductivity layer 130 also includes an exhaust drain, which provides a passageway from the exhaust cavity 145 to the fluid outlet 102. A tube 103, may be installed which passes through the exhaust drain and attaches to the fluid outlet 102.

Figure 4:
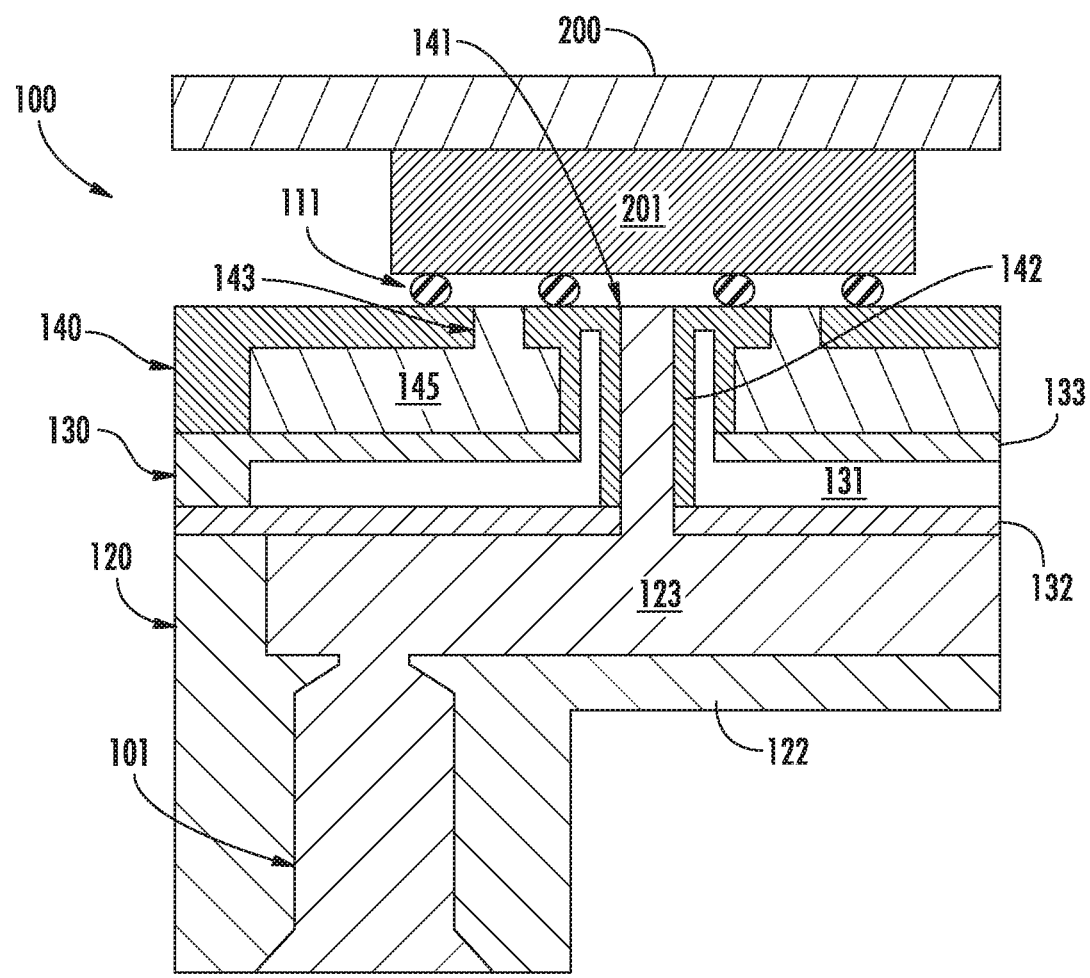
FIG. 4 shows a cross-sectional view of the assembly.

The exhaust manifold 140 is disposed on top of the low conductivity layer 130. The exhaust manifold may be manufactured of any suitable material, such as metals or plastics. The exhaust manifold 140 includes the openings 141 on the top surface which allow the supply fluid to be directed toward the PCB 200 or toward the heat generating devices 201 on the PCB 200. The exhaust manifold 140 may also include hollow projections 142 which extend downward from the openings 141, passing through the conduits 135 in the low conductivity layer 130, and terminating in the supply cavity 123. The exhaust manifold 140 may include sidewalls 144, which extend downward from the top surface. These sidewalls 144 create an exhaust cavity 145 between the underside of the top surface of the exhaust manifold 140 and the exhaust interface layer 133 (as best seen in FIG. 4). Finally, the exhaust manifold 140 includes drainage openings 143, which allow the fluid to drain into the exhaust cavity 145 formed between the exhaust manifold 140 and the exhaust interface layer 133.

As best seen in FIG. 2, the low conductivity layer 130 also serves to physically separate the sidewall 121 of the supply manifold 120 from the sidewall 144 of the exhaust manifold 140.

FIG. 4 shows a cross sectional view of an array backframe 100 with integral manifolds for high performance fluid cooling, according to one embodiment. The array backframe 100 combines tens or hundreds of individual fluid cooling paths into one modular frame. Additionally, the array backframe 100 features low conductivity cavities, which may be partial vacuums or foam, to prevent cross-talk between the supply and exhaust fluids, preserving thermal performance across the entire array.

FIG. 4 illustrates the internal manifolding concept for the array backframe 100 with integral fluid cooling manifolds. The array backframe 100 provides cool supply fluid to the heat generating devices 201 disposed on the PCB 200 and removes the warm exhaust fluid. To avoid non-uniformities in device temperature and performance, the flow to each heat generating device 201 is parallelized to receive fresh, cool fluid at each device. While this approach commonly produces unwieldy plumbing complexity, the array backframe 100 of the present disclosure reduces this to an internal manifold structure, leaving only two plumbing connections.

To avoid the parasitic losses (economizing of heat from the warm exhaust fluid to the cool supply fluid), the array backframe 100 separates all major flow paths using a low conductivity layer 130, which may comprise a partial vacuum or low conductivity foam. This ensures the coldest supply fluid reaches every heat generating device 201 in order to maintain the highest thermal performance of the arrayed system.

Referring to FIG. 4, cool supply fluid enters the array backframe 100 through the fluid inlet 101. This cool fluid passes into the supply cavity 123 disposed on the supply manifold 120. The hollow projections 142 from the exhaust manifold 140 extend downward to the supply cavity 123 to provide a passageway for the cool supply fluid to travel to the exhaust manifold 140 and exit through the openings 141. Since the pressure of the fluid in the supply cavity 123 is greater than the pressure at the interface with the heat generating devices 201, the fluid is transported upward through the hollow projections 142. This fluid contacts the heat generating device 201, thereby cooling that device. The fluid that is used as the supply fluid is not limited by this disclosure, and may be a liquid or a gas.

As described above with respect to FIG. 2, the PCB 200 may be secured to the array backframe 100 using fasteners 300. The fasteners 300 secure the PCB 200 to the array backframe 100 with sufficient pressure to insure that the seals 111 maintain a fluid-tight connection.

After contacting the heat generating device 201, the fluid, which is now referred to as exhaust fluid and is constrained by seals 111, passes through drainage openings 143 into the exhaust cavity 145. The exhaust cavity 145 is thermally isolated from the supply cavity 123 by the isolation cavity 131. The warm exhaust fluid disposed in the exhaust cavity 145 exits through the exhaust drain (not shown) to the fluid outlet 102.

Thus, in this embodiment, there are three cavities disposed in the array backframe 100. The supply cavity 123 is disposed near the lower surface of the array backframe 100 and contains cool supply fluid. The exhaust cavity 145 is disposed near the top surface of the array backframe 100 and contains the warm exhaust fluid. An isolation cavity 131 is disposed between the supply cavity 123 and the exhaust cavity 145 to maintain thermal isolation.

Figure 5:
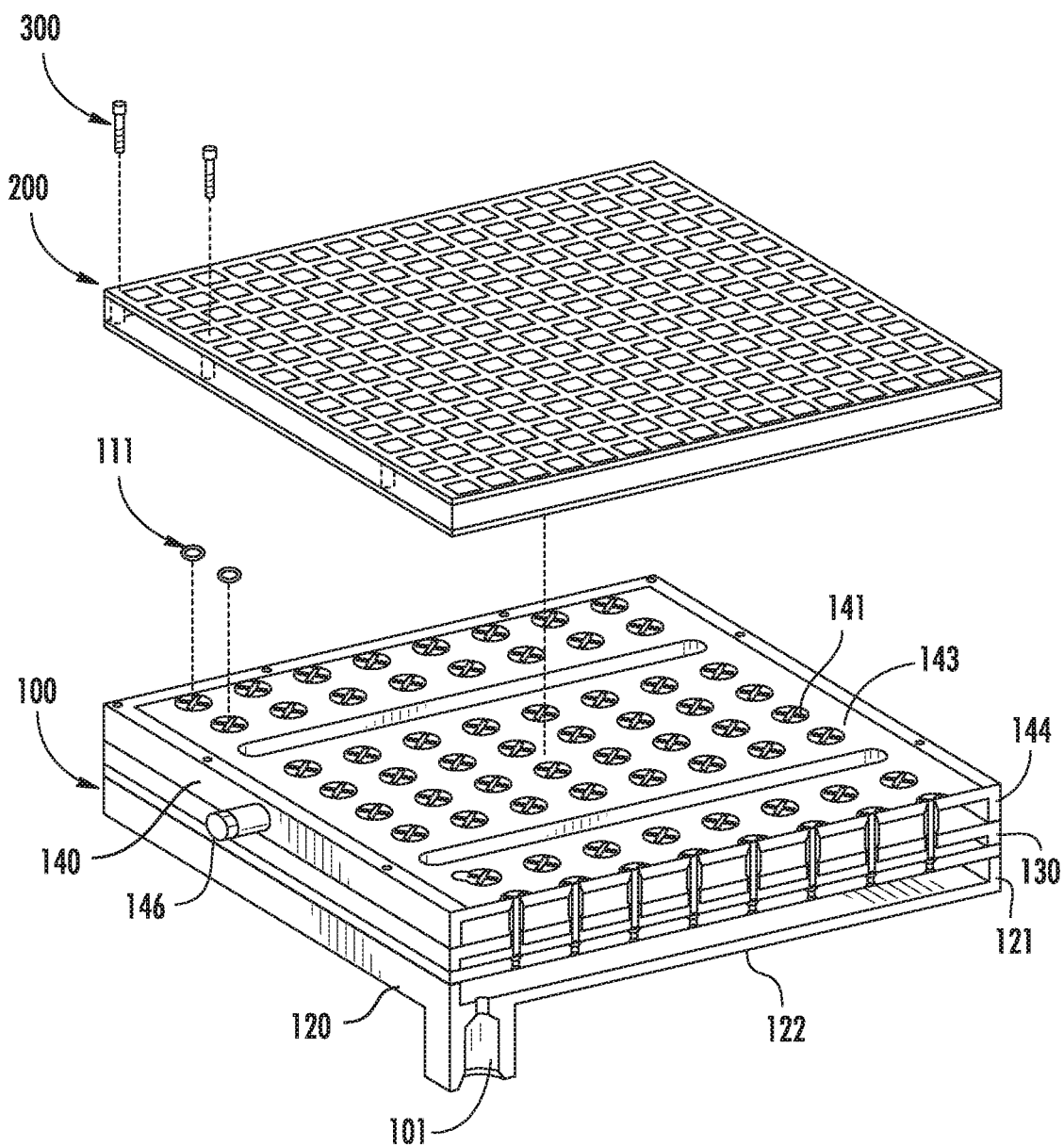
FIG. 5 shows a view of the assembly according to another embodiment.

While FIGS. 1-4 show one embodiment, other embodiments are also possible. For example, in one embodiment, shown in FIG. 5, the fluid outlet 146 is disposed on the exhaust manifold 140, directly in communication with the exhaust cavity 145. For example, the fluid outlet 146 may be disposed along the sidewall 144.

In each of the embodiments, the array backframe 100 includes a supply manifold 120, which includes a supply cavity 123 in communication with a fluid inlet 101. The array backframe 100 also includes an exhaust manifold, which includes an exhaust cavity 145. The exhaust cavity 145 is in communication with a fluid outlet 102, which may be disposed on the exhaust manifold 140 or on the supply manifold 120. The exhaust manifold 140 has openings 141 on its top surface through which supply fluid is transported from the supply cavity 123. The exhaust manifold 140 also has drainage openings 143 which return exhaust fluid to the exhaust cavity 145. A low conductivity layer 130 is disposed between the supply manifold 120 and the exhaust manifold 140, and serves to thermally isolate the supply cavity 123 from the exhaust cavity 145. The low conductivity layer 130 includes an isolation cavity disposed between a top surface that is disposed proximate the exhaust manifold 140 and a bottom surface that is disposed proximate the supply manifold 120. This isolation cavity 131 may be maintained at partial vacuum conditions or may be filled with air or foam.

Further, the openings 141 on the top surface are each aligned with a respective heat generating device 201 on the PCB 200. The number of openings 141 that may be disposed on the top surface is not limited by this disclosure. Thus, the array backframe 100 uses a single fluid inlet and a single fluid outlet, and can be used to cool an arbitrary number of heat generating devices mounted in a PCB 200. Further, because of the configuration of the array backframe 100, the temperature of the supply fluid supplied to each of the heat generating devices is roughly equal and is not affected by the introduction of additional heat generating devices.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. An array backframe, comprising:
   a supply manifold comprising a fluid inlet and a supply cavity in communication with the fluid inlet;
   an exhaust manifold comprising an exhaust cavity and a plurality of openings and drainage openings on a top surface, wherein the plurality of openings are in communication with the supply cavity and the drainage openings are in communication with the exhaust cavity; and
   a low conductivity layer, disposed between the supply manifold and the exhaust manifold to physically separate and thermally isolate the supply cavity and the exhaust cavity, wherein the supply manifold, the low conductivity layer and the exhaust manifold are three separate layers, and are configured such that the exhaust manifold is disposed on top of the low conductivity layer and the low conductivity layer is disposed on top of the supply manifold; and
   wherein the exhaust manifold comprises a plurality of hollow projections extending downward from the openings on the top surface, wherein the hollow projections pass through conduits in the low conductivity layer and terminate in the supply cavity such that the openings on the top surface are in fluid communication with the supply cavity.

2. The array backframe of claim 1, wherein the low conductivity layer comprises a top surface proximate the exhaust manifold and a bottom surface proximate the supply manifold, and an isolation cavity is disposed between the top surface and the bottom surface.

3. The array backframe of claim 2, wherein the isolation cavity is maintained in a partial vacuum condition.

4. The array backframe of claim 2, wherein the isolation cavity is filled with air or foam.

5. The array backframe of claim 2, wherein the low conductivity layer comprises two or more sheets, which, when joined, create the isolation cavity.

6. The array backframe of claim 1, wherein the plurality of openings comprise microjets.

7. The array backframe of claim 1, wherein the exhaust cavity is in communication with a fluid outlet, and the fluid outlet is disposed in the supply manifold.

8. The array backframe of claim 1, wherein the exhaust cavity is in communication with a fluid outlet, and the fluid outlet is disposed in the exhaust manifold.

9. An assembly, comprising: a printed circuit board having a plurality of heat generating devices mounted thereon, affixed to the array backframe of claim 1.

10. The assembly of claim 9, wherein each of the plurality of openings is aligned with a respective one of the plurality of heat generating devices.

11. The assembly of claim 9, wherein the low conductivity layer comprises a top surface proximate the exhaust manifold and a bottom surface proximate the supply manifold, and an isolation cavity is disposed between the top surface and the bottom surface.

12. An assembly comprising:
   an array backframe, comprising:
      a supply manifold comprising a fluid inlet and a supply cavity in communication with the fluid inlet;
      an exhaust manifold comprising an exhaust cavity and a plurality of openings and drainage openings on a top surface, wherein the plurality of openings are in communication with the supply cavity and the drainage openings are in communication with the exhaust cavity; and
      a low conductivity layer, disposed between the supply manifold and the exhaust manifold to physically separate and thermally isolate the supply cavity and the exhaust cavity, wherein the supply manifold, the low conductivity layer and the exhaust manifold are three separate layers, and are configured such that the exhaust manifold is disposed on top of the low conductivity layer and the low conductivity layer is disposed on top of the supply manifold;

a printed circuit board having a plurality of heat generating devices mounted thereon, affixed to the top surface of the array backframe; and a fluid, wherein the fluid enters the supply cavity via the fluid inlet, passes through hollow projections connecting the supply cavity and the plurality of openings, impacts the plurality of heat generating devices on the printed circuit board, enters the drainage openings after impacting the plurality of heat generating devices and returns to the exhaust cavity.

13. The assembly of claim 12, wherein the hollow projections are in communication with the plurality of openings and extend downward from the top surface, wherein the hollow projections pass through conduits in the low conductivity layer and terminate in the supply cavity.

14. The assembly of claim 12, wherein the fluid in the supply cavity is at a lower temperature than the fluid in the exhaust cavity, and a temperature difference is maintained due to the low conductivity layer.

15. The assembly of claim 12, wherein the fluid exits the exhaust cavity through an outlet in the supply manifold.

16. The assembly of claim 12, wherein the fluid exits the exhaust cavity through an outlet in the exhaust manifold.

* * * * *